United States Patent [19]

Singlevich et al.

[11] Patent Number: 5,759,876
[45] Date of Patent: *Jun. 2, 1998

[54] METHOD OF MAKING AN ANTIFUSE STRUCTURE USING A METAL CAP LAYER

[75] Inventors: Scott G. Singlevich; Bradley S. Holway; Kurt D. Humphrey; Brian Scott Poarch; Michael R. Reeder; Neal J. Verzwyvelt, all of Colorado Springs, Colo.

[73] Assignee: United Technologies Corporation, Windsor Locks, Conn.

[*] Notice: The term of this patent shall not extend beyond the expiration date of Pat. No. 5,658,819.

[21] Appl. No.: 551,588

[22] Filed: Nov. 1, 1995

[51] Int. Cl.$^6$ .................................................. H01L 21/82
[52] U.S. Cl. .................... 438/131; 438/467; 438/600; 438/DIG. 901
[58] Field of Search ........................... 438/131, 467, 438/600, DIG. 901; 257/530

[56] References Cited

U.S. PATENT DOCUMENTS

| | | | |
|---|---|---|---|
| 4,499,557 | 2/1985 | Holmberg et al. | 365/163 |
| 4,569,121 | 2/1986 | Lim et al. | 29/574 |
| 4,748,490 | 5/1988 | Hollingsworth | 357/54 |
| 4,881,114 | 11/1989 | Mohsen et al. | 357/54 |
| 4,914,055 | 4/1990 | Gordon et al. | 437/192 |
| 5,070,384 | 12/1991 | McCollum et al. | 357/51 |
| 5,166,556 | 11/1992 | Hsu et al. | 307/465 |
| 5,181,096 | 1/1993 | Forouhi | 257/530 |
| 5,210,598 | 5/1993 | Nakazaki et al. | 257/530 |
| 5,248,632 | 9/1993 | Tung et al. | 437/195 |
| 5,272,101 | 12/1993 | Forouhi et al. | 437/50 |
| 5,290,734 | 3/1994 | Boardman et al. | 437/195 |
| 5,300,456 | 4/1994 | Tigelaar et al. | 437/195 |
| 5,308,795 | 5/1994 | Hawley et al. | 437/195 |
| 5,322,812 | 6/1994 | Dixit et al. | 437/60 |
| 5,353,264 | 10/1994 | Tsang et al. | 365/96 |
| 5,362,676 | 11/1994 | Gordon et al. | 437/192 |
| 5,374,832 | 12/1994 | Tung et al. | 257/50 |
| 5,427,979 | 6/1995 | Chang | 437/190 |
| 5,463,244 | 10/1995 | De Araujo et al. | 257/530 |
| 5,469,379 | 11/1995 | Levy | 365/96 |
| 5,475,253 | 12/1995 | Look et al. | 257/530 |
| 5,493,146 | 2/1996 | Pramanik et al. | 257/530 |
| 5,557,137 | 9/1996 | Cohen | 257/530 |
| 5,565,703 | 10/1996 | Chang | 257/530 |
| 5,572,458 | 11/1996 | Smith et al. | 365/96 |
| 5,658,819 | 8/1997 | Humphrey et al. | 438/600 |

FOREIGN PATENT DOCUMENTS

| | | |
|---|---|---|
| 0483958A1 | 6/1992 | European Pat. Off. . |
| 0558176A1 | 1/1993 | European Pat. Off. . |
| 0564138A1 | 6/1993 | European Pat. Off. . |
| 0660408A1 | 6/1995 | European Pat. Off. . |

OTHER PUBLICATIONS

V. Jain et al, "Amorphous Silicon Anti–Fuse for High Speed FPGA Application", Conference Proceedings, 5th Annual IEEE Intl. ASIC Conference, pp. 111–113, 1992.

*Primary Examiner*—Charles L. Bowers, Jr.
*Assistant Examiner*—Lynne A. Gurley

[57] ABSTRACT

An antifuse includes a metal cap layer located at the second barrier layer of the antifuse to improve the antifuse yield and long term reliability. An antifuse further includes one or more interfacial oxide film layers surrounding an antifuse dielectric layer to provide narrowing of the antifuse programming voltage distribution and to further improve the antifuse yield and long term reliability.

27 Claims, 7 Drawing Sheets

METHOD OF MAKING AN ANTIFUSE STRUCTURE USING A METAL CAP LAYER

TECHNICAL FIELD

This invention relates to semiconductor devices and more particularly to antifuses.

BACKGROUND ART

As known in the art, many programmable integrated circuits use antifuses as their programmable elements.

Programmable integrated circuits are semiconductor devices which provide an assortment of internal logic functions along with programmable elements that allow users to select the particular logic functions they desire. Antifuses are one such programmable element.

Programmable integrated circuits are fabricated on semiconductor wafers. A typical 6 inch semiconductor wafer contains hundreds of programmable integrated circuit die and the typical integrated circuit contains thousands of antifuses. Thus there are typically millions of antifuses on a single 6 inch semiconductor wafer.

An antifuse uses a layer of dielectric material to achieve its programmable characteristic. As manufactured, a layer of dielectric material gives the antifuse a very high impedance. One dielectric material often used is hydrogenated amorphous silicon (a—Si:H). An antifuse is programmed by applying a voltage of appropriate magnitude and duration to the antifuse. During programming, the antifuse undergoes permanent physical change, the programming voltage breaks down the high impedance dielectric in the antifuse, which results in an element with a much lower impedance. The thickness of the amorphous silicon is a significant factor in determining the magnitude of the voltage needed to program an antifuse. Because the manufacturing process is not perfectly uniform across the entire wafer, some antifuses demonstrate higher or lower programming voltages than other antifuses. It is believed that variations in the amorphous silicon dielectric layer across the wafer is one reason for this variation in antifuse programming voltages. The range of programming voltages demonstrated by the antifuses is called the programming voltage distribution.

Manufacturers of antifuse programmable logic arrays have been seeking antifuse structures with narrower programming voltage distributions so as to achieve higher yield and greater long term reliability. Yield represents the percentage of manufactured components which initially meet the specifications for the product. Reliability represents the integrity of the components over time, i.e. whether the components continue to the meet specifications over long term use. High reliability requires that antifuses maintain high impedance when not programmed. A narrow programming voltage distribution also helps to meet this requirement. Due to the volume of antifuses in a semiconductor, an antifuse structure or process which provides even a modest improvement in the yield or reliability of individual antifuses can represent a substantial breakthrough in the yield or reliability when measured at the device level.

DISCLOSURE OF INVENTION

An object of the present invention is to provide a structure and process of manufacture for an antifuse which has a narrower range of programming voltages.

Another object of the present invention is to provide a structure and process of manufacture for an antifuse which has higher yield and reliability.

According to the present invention an antifuse having an antifuse dielectric layer disposed between a first and second barrier layer, further includes a metal cap layer above the second barrier layer.

In further accord with the present invention an antifuse having an antifuse dielectric layer disposed between a first and second barrier layer, further includes a metal cap layer above the second barrier layer, and further includes an interfacial oxide film layer disposed between the first barrier layer and the antifuse dielectric layer.

In still further accord with the present invention an antifuse having an antifuse dielectric layer disposed between a first and second barrier layer, further includes a metal cap layer above the second barrier layer, and further includes two interfacial oxide film layers, one each disposed between the dielectric layer and a corresponding one of the first and second barrier layers.

The metal cap layer improves antifuse yield and may also improve the antifuse long term reliability. The further addition of one or more interfacial oxide film layers narrows the antifuse programming voltage distribution and further improves the yield and long term reliability of the antifuses. These improvements are especially significant to the hi-rel market.

These and other objects, features, and advantages of the present invention will become apparent in light of the following detailed description of a best mode embodiment, accompanying Drawings, and claims.

BEST MODE FOR CARRYING OUT THE INVENTION

The present invention is to an improved antifuse with a narrower antifuse programming voltage distribution, a higher antifuse yield, and greater antifuse long term reliability. This improvement results from a change in the structure of an antifuse and is taught below with reference to a prior art device.

Figure 1:
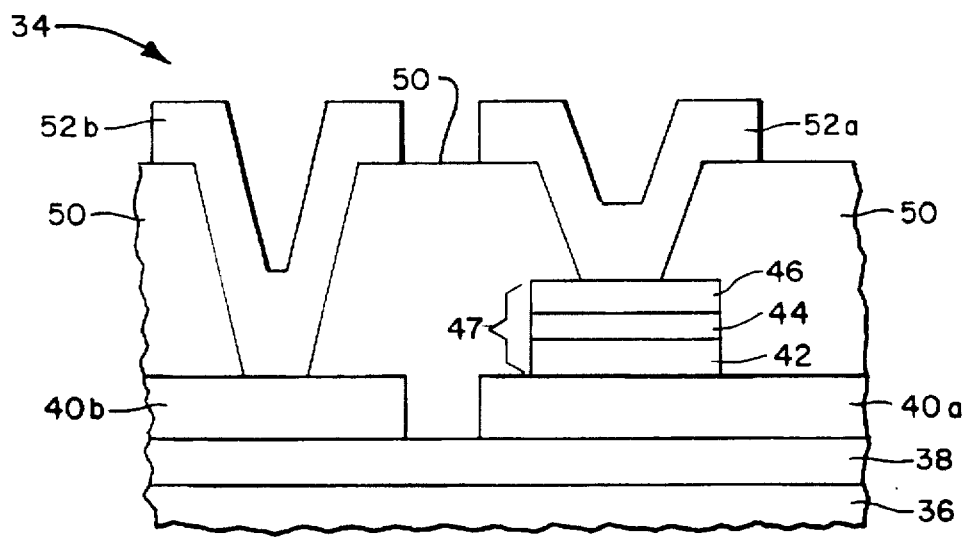
FIG. 1 is a cross-sectional view of a portion of a prior art semiconductor device.

FIG. 1 depicts a cross sectional view of a portion 34 of a prior art semiconductor device of the type having an antifuse 47. The portion 34 of the semiconductor device further comprises a substrate 36, a lower dielectric layer 38, a first metal layer with a plurality of interconnects 40a, 40b positioned on the top surface of the lower dielectric layer 38, and a second metal layer with a plurality of contacts 52a, 52b (sometimes referred to in the industry as "vias") above the first metal layer interconnects 40a, 40b. An intermetal dielectric layer 50 is positioned between and in contact with the first metal layer interconnects 40a, 40b and the second metal layer contacts 52a, 52b. The antifuse 47 is also positioned between and in contact with the first metal layer interconnect 40a and the second metal layer contact 52a.

The substrate 36, may be, but is not limited to, any MOS, bipolar or BICMOS process device. The substrate 36 may be passive or may contain active elements, such as transistors.

The lower dielectric layer 38 is generally comprised of a silicate dielectric such as borophosphosilicate glass. The lower dielectric layer 38 provides electrical isolation, where necessary, between the first metal layer interconnects 40a, 40b and the substrate 36.

The first metal layer interconnects 40a, 40b and the second metal layer contacts 52a, 52b are typically comprised of an electrical conductor such as aluminum or aluminum alloy. The first metal layer interconnect 40a and the second metal layer contact 52a each provide an electrical connection to the antifuse 47.

The intermetal dielectric layer 50 is generally comprised of a silicate dielectric such as silicon dioxide. The intermetal dielectric layer 50 provides electric isolation, where necessary, between the first metal layer interconnects 40a, 40b and the second metal layer contacts 52a, 52b.

The antifuse 47 consists of a first barrier layer 42, a second barrier layer 46, and an antifuse dielectric layer 44, positioned between and in contact with the first barrier layer 42 and second barrier layer 46.

The first barrier layer 42 prevents the first metal layer interconnect 40a from unwanted chemical interaction with the antifuse dielectric layer 44 during the manufacturing process. The first barrier layer 42 also serves as the bottom electrode for the antifuse 47. The first barrier layer 42 is usually comprised of a conductor which is also a chemical diffusion barrier, such as titanium tungsten, (TiW).

The antifuse dielectric layer 44 is the programmable element of the antifuse 47 and is generally comprised of undoped hydrogenous amorphous silicon (a—Si:H). In its initial unprogrammed state, the antifuse dielectric layer 44 is a high impedance element which provides electrical isolation between the first barrier layer 42 and the second barrier layer 46. Upon application of the appropriate programming voltage, the antifuse dielectric layer 44 is broken down and subsequently provides a low impedance between the first barrier layer 42 and the second barrier layer 46.

The second barrier layer 46 is typically comprised of a conductor which is also a chemical diffusion barrier, such as titanium tungsten, TiW. The second barrier layer 46 prevents the antifuse dielectric layer 44 from unwanted chemical interaction with the second metal layer contact 52a during the manufacturing process. The second barrier layer 46 also serves as the top electrode for the antifuse 47.

The prior art antifuses of an integrated circuit are individually programmed by addressing transistors (not shown) which are internal to the programmable logic array, and which are electrically connected to the antifuse to be programmed. Addressing turns on these transistors to create electrically conductive paths from an external power supply to the second metal layer contact 52a, and from the first metal layer interconnect 40a to ground, which allows a specified programming voltage to be applied across the antifuse electrodes 42, 46. This provides an electric field across the antifuse dielectric layer 44 that causes a large increase in the current through the antifuse. The increased current produces localized heating and a fusing of portions of the antifuse dielectric layer with the first and second barrier layers. The resulting programmed antifuse exhibits an irreversible low impedance path between the first barrier layer and the second barrier layer through the antifuse dielectric layer.

The prior art device has problems in that the range of programming voltages is wider than desired, resulting in reduced antifuse yield and lower long term reliability.

FIGS. 2–9 are cross-sectional views which illustrate progressive steps in the formation of a portion of an antifuse in accordance with the present invention.

As understood by those skilled in the art, all of the figures are schematic representations and are not intended to portray the specific parameters or structural details of the invention.

Figure 2:
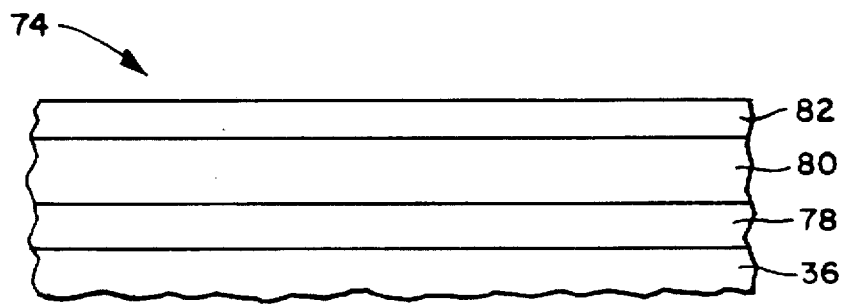
FIGS. 2–9 are cross-sectional views of one portion of an antifuse in accordance with the present invention.

Referring to FIG. 2, a portion 74 of a semiconductor device includes a substrate 36, which has deposited on its exposed major surface a lower dielectric layer 78. The lower dielectric layer 78 provides electrical isolation, where necessary, from the substrate 36. The lower dielectric layer 78 is generally comprised of a silicate dielectric such as borophosphosilicate glass (BPSG). However, those skilled in the art know that many alternatives are available for the lower dielectric layer 78 including phosphosilicate glass (PSG) and silicon dioxide.

The lower dielectric layer 78 has deposited on its exposed major surface, a first metal layer 80. The first metal layer 80 is deposited using sputter deposition or some other semiconductor processing technique, such as evaporation deposition. The first metal layer 80 is typically comprised of an electrical conductor such as aluminum or an aluminum alloy. The preferred embodiment uses a 98.5 percent (%) aluminum, 0.5% copper, 1% silicon alloy by weight. Alternatives known to those of ordinary skill in the art include, but are not limited to, other alloys of aluminum-silicon-copper and titanium doped aluminum with silicon.

A first barrier layer 82 is deposited on the exposed major surface of the first metal layer 80. The first barrier layer 82 prevents the first metal layer 80 from unwanted chemical interacting with the antifuse layers during the manufacturing process. The first barrier layer 82 also serves as the bottom electrode for the antifuse. In the preferred embodiment, the first barrier layer 82 is a TiW composition, comprising 10% titanium and 90% tungsten by weight. The thickness of the first barrier layer 82 is generally in the range of from 1,000 angstroms to 2,000 angstroms, preferably 1,550 angstroms. The first barrier layer 82 is deposited using sputter deposition or some other semiconductor processing technique, such as evaporation deposition. Although the preferred embodiment uses a sputter deposited TiW composition for the first barrier layer 82, those of ordinary skill in the art should recognize that titanium nitride or other conductive diffusion barrier materials may also be used for the first barrier layer. In such instances, a deposition technique that is suitable for the material in the application, such as reactive sputtering or chemical vapor deposition, should also be used.

Figure 3:
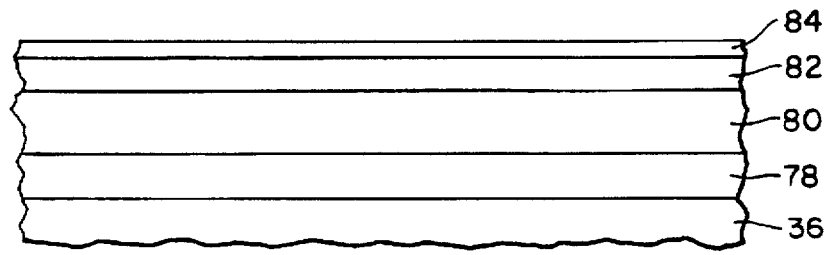

Referring now to FIG. 3, an interfacial oxide film layer 84 is formed at the exposed major surface of the first barrier layer 82. The interfacial oxide film layer 84 provides a significant improvement in the programming voltage distribution, antifuse yield and antifuse long term reliability. The interfacial oxide film layer 84 is formed without consideration of any native metal oxidation which may already exist. Native metal oxidation is generally defined as the oxidation that spontaneously takes place when the material is exposed to ambient air, i.e. temperature, pressure, humidity, etc.

In the preferred embodiment, the interfacial oxide film layer 84 is formed by subjecting the exposed major surface of the first barrier layer 82 to monatomic oxygen in a conventional single-wafer down-stream plasma resist stripper, or any other suitable chamber. The process chamber is pumped down to a reduced pressure and backfilled with gaseous oxygen to a pressure between 10 milliTorr and 500 Torr, preferably 3.75 Torr. The temperature in the process chamber should be between 100 degrees centigrade (deg C) and 400 deg C, preferably from 160 deg C to 260 deg C. In a second chamber that is separate from, but connected to, the process chamber, an RF generator is used to ionize the gaseous oxygen to produce monatomic oxygen. The RF generator is set to an output power that is determined by the specific generator design, power supply, and chosen process conditions. A power of 450 Watts, has been shown to be suitable. The frequency of the RF generator is set at 13.56 megahertz (Mhz); 13.56 Mhz has been approved by the FCC for industrial RF generators involving low pressure plasmas. Any other frequency or means that is suitable for the ionization of gaseous oxygen into monatomic oxygen may also be used. The monatomic oxygen flows out of the second chamber into the process chamber. The interfacial oxide film layer 84 is produced as the monatomic oxygen bathes the exposed surface of first barrier layer 82 in the process chamber. In the preferred embodiment, the cumulative exposure time is in the range of from 15 seconds to 30 minutes, preferably 1 minute to 10 minutes. Beneficial effects of varying degrees can be produced by other cumulative exposure times. Furthermore, those skilled in the art know that the appropriate cumulative exposure time is dependent on the process parameters, such as temperature and pressure, all of which may be varied while still producing the same result. The cumulative exposure of the surface of the first barrier layer 82 to the monatomic oxygen environment need not be continuous, and has actually been interrupted by exposing the surface of the first barrier layer 82 to to an ambient environment for a time ranging from 19 minutes to 2 hours. It is believed that there is no maximum or minimum limit on this interruption time.

The thickness of the interfacial oxide film layer 84 is small compared to the other layers, typically in the range of about 10 angstroms to 100 angstroms, preferrably about 40 angstroms to 70 angstroms, although the interfacial oxide film layer is not limited to these ranges. By comparison however, the thickness of a native metal oxide is typically less than 20 angstroms.

A portion of the interfacial oxide film layer lies below, or penetrates, the initial surface of the first barrier layer upon which the interfacial oxide film layer is formed. The penetration depth of an interfacial oxide film layer is greater than that of a native metal oxide film. The preferred process insures a sufficient thickness and penetration depth, but any other process or method, as known to those skilled in the art, that provides similar results may also be used.

Figure 4:
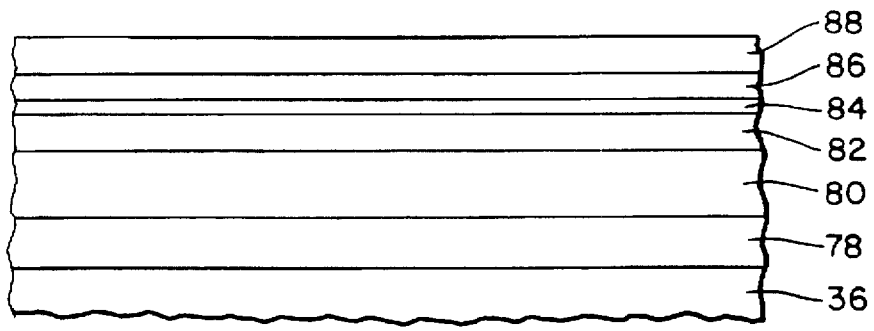

Referring now to FIG. 4, an antifuse dielectric layer 86 is deposited on the exposed major surface of the interfacial oxide film layer 84. The antifuse dielectric layer 86 is deposited using plasma enhanced chemical vapor deposition (PECVD), or some other semiconductor processing technique, such as low pressure chemical vapor deposition (LPCVD). The thicknesses of the interfacial oxide film layer 84 and the antifuse dielectric layer 86 control the programming voltage. To obtain a programming voltage distribution ranging from 7.5 volts to 12 volts, the thickness of the antifuse dielectric layer 86 is substantially in the range of from 800 angstroms to 1,600 angstroms. In the preferred embodiment, the thickness of the antifuse dielectric layer 86 is adjusted to obtain a median programming voltage in the range of from 10.0 volts to 10.5 volts, 1,125 angstroms +/−20 angstroms is preferred. Other thicknesses of the antifuse dielectric layer 86 could be used to obtain a corresponding higher or lower programming voltage distribution.

The antifuse dielectric layer 86 is generally comprised of undoped hydrogenated amorphous silicon (a—Si:H) which is a high impedance insulator. However, it should be obvious to one of ordinary skill in the art that other compositions may also be used.

The antifuse dielectric layer 86 has deposited on its exposed major surface a second barrier layer 88. The second barrier layer 88 is deposited using sputter deposition or some other semiconductor processing technique, such as evaporation deposition. The second barrier layer 88 prevents the antifuse dielectric layer 86 from unwanted chemical interaction with subsequent layers during the manufacturing process. The second barrier layer 88 also serves as the top electrode for the antifuse. In the preferred embodiment, the second barrier layer 88 is a TiW composition, comprising 10% titanium and 90% tungsten by weight. The thickness of the second barrier layer 88 is generally in the range of from 1,000 angstroms to 2,000 angstroms, preferably 1,550 angstroms. Although the preferred embodiment uses a sputter deposited TiW composition, those of ordinary skill in the art should recognize that titanium nitride or other conductive diffusion barrier materials may also be used. In such instances, a deposition technique that is suitable for the material in the application, such as reactive sputtering or chemical vapor deposition, should also be used.

Figure 5:
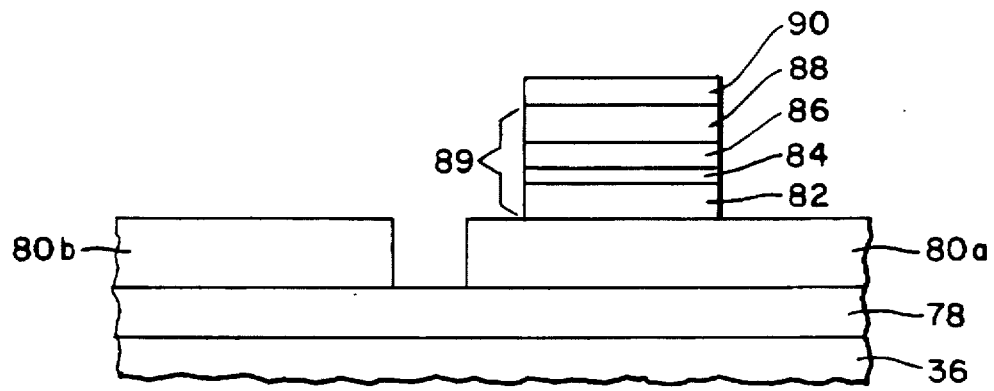

Referring now to FIG. 5, following the deposition of the second barrier layer 88, an antifuse 89 is formed by patterned etching of layers 82, 84, 86 and 88, as described hereinafter.

Several techniques for etching are known to those skilled in the art. In the preferred embodiment, photoresist is applied and patterned. The patterned photoresist 90 defines the location for an antifuse 89. Subsequently, an etch is then performed generally using at least one of tetrafluoromethane ($CF_4$), oxygen ($O_2$) and chlorine ($Cl_2$) etch chemistries. The portion of each layer which is located beneath the patterned photoresist 90 is left intact as part of the antifuse 89, and the rest of each layer is removed by the etch process. The first metal layer 80 serves as an etch stop.

Following the antifuse 89 etching, the first metal layer 80 is patterned into first metal layer interconnects 80a, 80b. Techniques for patterning the first metal layer 80 are known to those skilled in the art. In the preferred embodiment, photoresist is patterned over those areas of the first metal layer that are to become first metal layer interconnects 80a, 80b. Subsequently, an etch is then performed preferably using plasma dry etch techniques along with trifluoromethane ($CHF_3$), $Cl_2$ and boron trichloride ($BCl_3$) chemistries. The first metal layer interconnects 80a, 80b beneath the patterned photoresist are left intact, and the rest of the first metal layer is removed by the etch process. The lower dielectric layer 78 serves as an etch stop. Following patterning of first metal layer interconnects 80a, 80b, all photoresist is removed.

Figure 6:
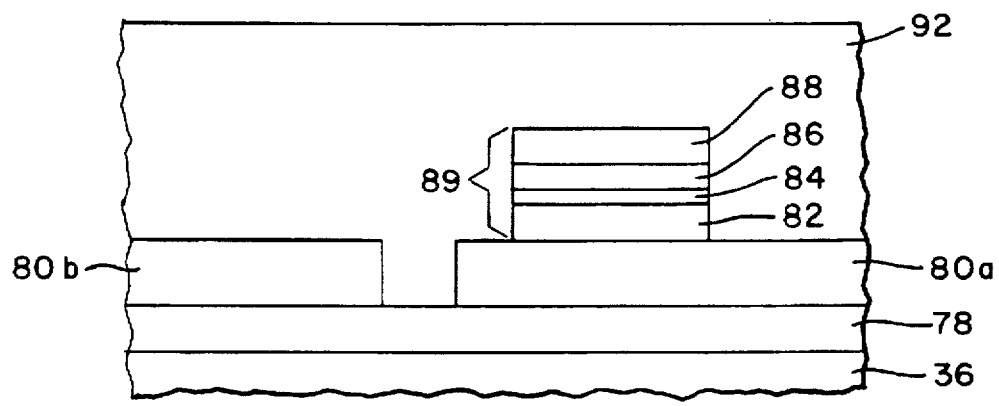

Referring now to FIG. 6, an intermetal dielectric layer 92 is deposited on the exposed surfaces of the lower dielectric layer 78, the first metal layer interconnects 80a, 80b, and the antifuse 89. The intermetal dielectric layer 92 is generally deposited through either PECVD, LPCVD or atmospheric pressure chemical vapor deposition, (APCVD). These techniques are known to those skilled in the art. The intermetal dielectric layer 92 is then planarized.

The intermetal dielectric layer 92 generally comprises at least one of silicon dioxide, BPSG and PSG. The intermetal dielectric layer 92 has a substantial thickness, preferably in the range of from 6,000 angstroms to 15,000 angstroms prior to planarization, to enable sufficient coverage of the antifuse 89 and first metal layer interconnects 80a, 80b, to thereby insulate them from subsequent layers.

Figure 7:
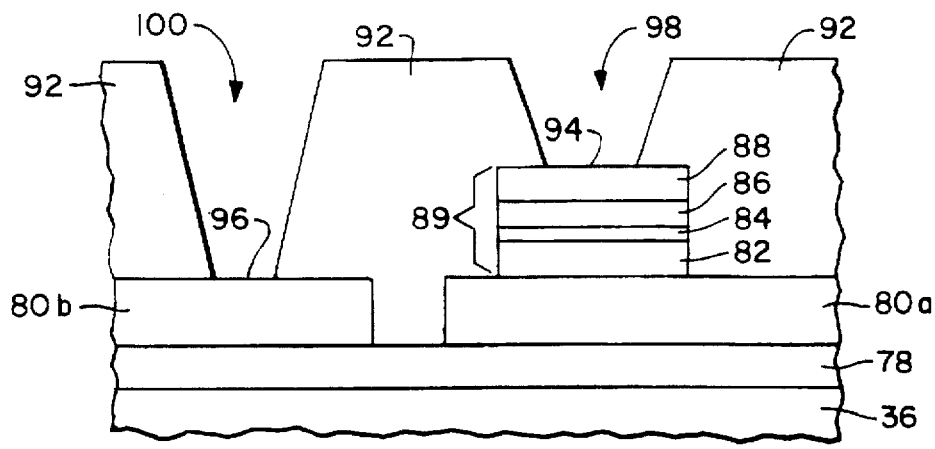

Referring now to FIG. 7, the intermetal dielectric layer 92 is patterned to create via 98 to the surface 94 of the antifuse 89 and via 100 to the surface 96 of first metal layer interconnect 80b.

The step of patterning, as described hereinabove, incorporates several process steps. In one embodiment, a layer of photoresist is patterned over those areas adjacent to vias 98, 100. Further, photoresist is exposed and developed away where vias 98, 100 are to be formed. Thus, by means of an etching step, vias 98 and 100 are created simultaneously. In the preferred embodiment, however, two separate photoresist deposition and etching steps are employed for each via, 98, 100. The purpose of the preferred embodiment is in preventing premature damage to the antifuse.

Figure 8:
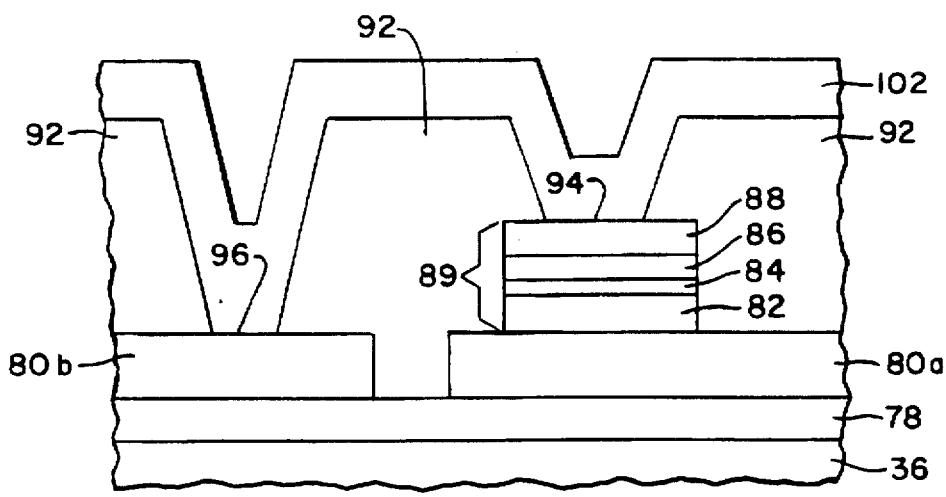

Referring to FIG. 8, upon making vias 98 and 100, a second metal layer 102 is formed superjacent the resultant structure of FIG. 7. The second metal layer 102 is typically comprised of an electrical conductor such as aluminum or an aluminum alloy with a thickness that is substantially in the range of from 6,000 angstroms to 10,500 angstroms. In one embodiment of the present invention, second metal layer 102 preferably comprises an aluminum (98.5% concentration by weight), copper (0.5% concentration by weight) and silicon (1% concentration by weight) alloy. Alternatives known to those of ordinary skill in the art include, but are not limited to, other alloys of aluminum-silicon-copper and titanium doped aluminum with silicon. The formation of second metal layer 102 can be achieved through various known, prior art methods, including evaporation and sputtered deposition techniques.

Figure 9:
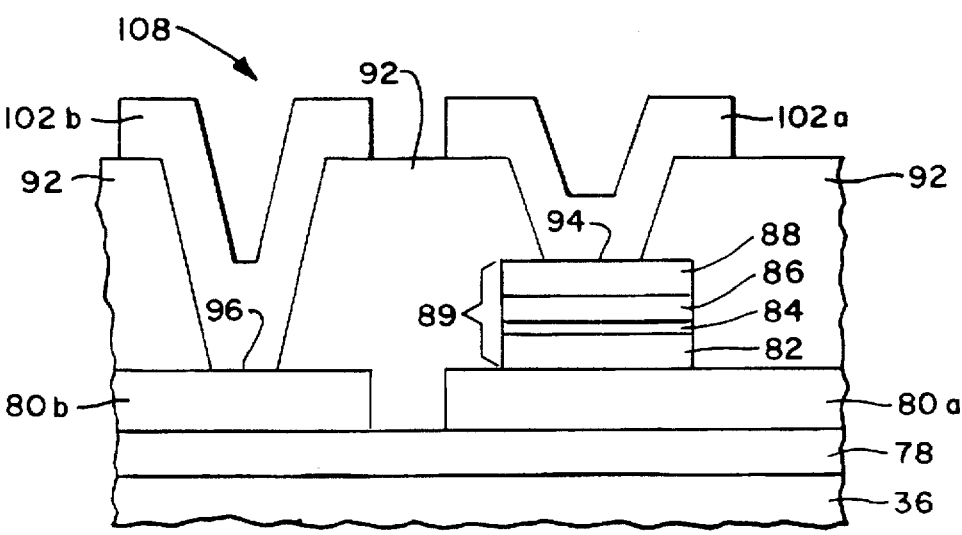

Referring to FIG. 9, the second metal layer 102 of FIG. 8 is patterned to define conductive paths and create second metal layer contacts 102a, 102b.

The step of patterning, as described herein, incorporates several process steps. In one embodiment, a layer of photoresist is patterned over regions of the second metal layer 102 in FIG. 8 which will form the second metal layer contacts 102a, 102b in FIG. 9. The etching step preferably employs plasma dry etching techniques which include $Cl_2$, $BCl_3$, or $CHF_3$ Once etched, the remaining photoresist is removed.

By this arrangement, second metal layer contact 102a is electrically connected with the antifuse 89 by means of surface 94. Similarly, second metal layer contact 102b is electrically connected with first metal layer interconnect 80b by means of surface 96.

The addition of the interfacial oxide film layer 84 prior to the deposition of the antifuse dielectric layer 86 significantly narrows the range of programming voltages of the antifuses, by on the order of magnitude of a volt. The addition of the interfacial oxide film layer 84 also produces an improvement in the yield and long term reliability of the antifuses. These improvements are especially significant to the hi-rel market.

There are several possible explanations for the beneficial electrical effects provided by the interfacial oxide film layer. The greater penetration depth of the interfacial oxide film layer over the native metal oxide may be partly responsible. For a first barrier layer such as TiW to be a good diffusion barrier, the grain boundaries must be "stuffed" (or "filled") to prevent the antifuse dielectric layer from diffusing into the first barrier layer. It is believed that the greater penetration depth of the interfacial oxide film layer provides more thorough stuffing of the grain boundaries in the first barrier layer, and thereby reduces the diffusion of the antifuse dielectric layer into the first barrier layer.

It is also believed that the beneficial effects result in part from the interfacial oxide film layer's ability to smooth fine scale features of the first barrier layer surface. For example, a first barrier layer can have sharp points on its surface. These sharp points correspond to individual grains or facets. The electric field in the neighborhood of these sharp points is highly concentrated, thereby resulting in non uniform stress on the antifuse dielectric layer, and consequently, a less predictable antifuse programming voltage. The formation of an interfacial oxide film layer may provide some smoothing of sharp points on the surface of the first barrier layer. A smoother surface provides a more uniform electric field across the antifuse dielectric layer, and consequently, a more predictable antifuse device.

It is further believed that the addition of the interfacial oxide film layer changes the surface morphology and/or physical or chemical properties of the antifuse dielectric layer 86. The properties of deposited layers are impacted by the properties of the surface upon which they are deposited. Since the interfacial oxide film layer has distinguishing physical characteristics compared to a simple native metal oxide, e.g. greater thickness, an antifuse dielectric layer that is deposited on an interfacial oxide film layer may have a different surface morphology, density or crystalite size and/or orientation than that which is deposited on a simple native metal oxide film.

The interfacial oxide film layer 84 also impacts the dielectric properties of the antifuse 89. The chemical composition of the interfacial oxide film layer 84 is not known but can be assumed to is be a mixture of tungsten, titanium and oxygen. The high dielectric constants associated with titanium and tungsten oxides could explain the difference in the measured dielectric properties, eg. capacitance, of the antifuse 89 compared to those of an antifuse without the interfacial oxide film layer 84.

Although the interfacial oxide film layer 84 is shown deposited on the first barrier layer 82 and in contact with the antifuse dielectric layer 86, for purposes of the present invention, this is not to the exclusivity of other materials which may also be disposed between the first barrier layer 82 and the antifuse dielectric layer 86 as long as the interfacial oxide film layer 84 is disposed between the first barrier layer 82 and the antifuse dielectric layer 86.

Furthermore, although the antifuse 89 is shown in a semiconductor device that contains internal transistors for addressing and programming the antifuse 89, this is not to the exclusion of other types of devices, both semiconductor and non semiconductor, in which the antifuse 89 may be formed. As described hereinabove, the substrate 36 may be passive or may contain active elements, and may be, but is not limited to, any MOS, bipolar or BICMOS process device. Thus, a semiconductor may not have such internal transistors for programming the antifuse 89, in which case the manner of programming would be modified compared to the description above. Or, for example, the antifuse 89 may be formed, with or without other passive components, as part of a device that is not a semiconductor device that may have a substrate comprised of a dielectric material such as ceramic or plastic.

Figure 10:
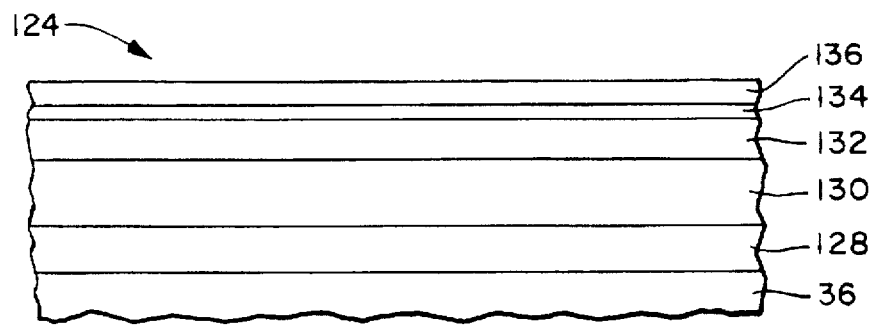
FIGS. 10–12 are cross-sectional views of another portion of an antifuse in accordance with the present invention.
Figure 11:
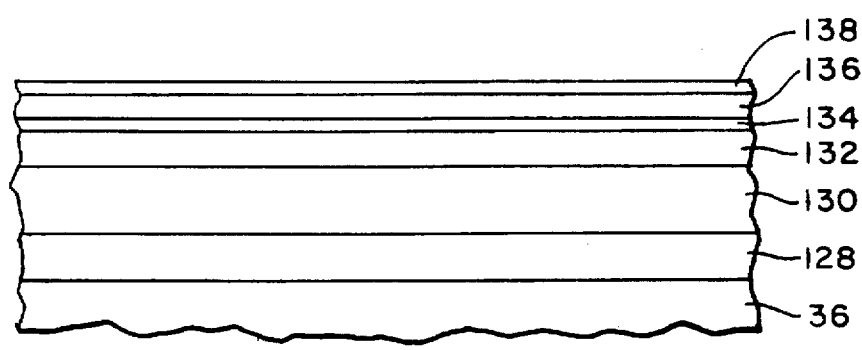
Figure 12:
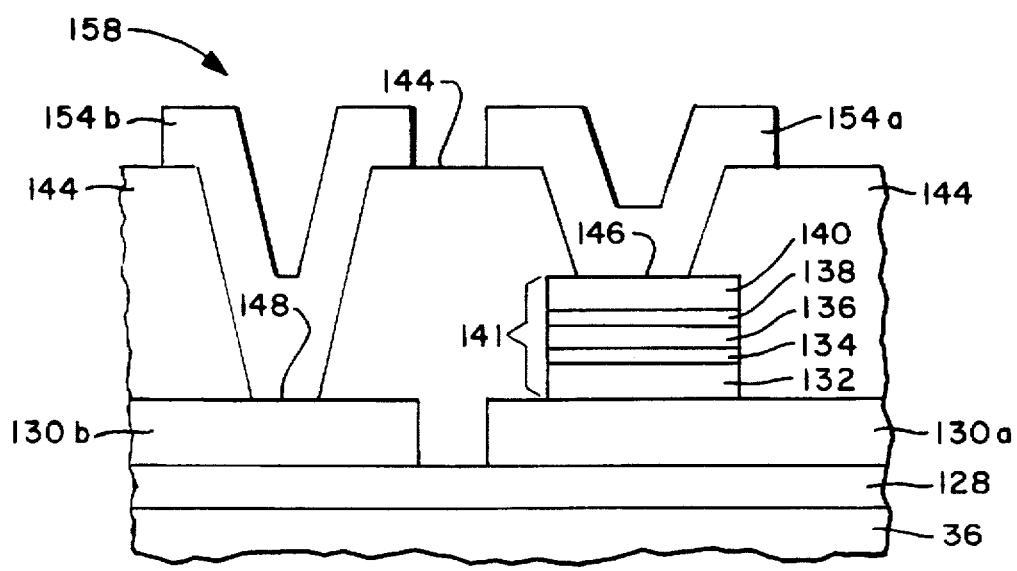

FIGS. 10–12 are cross sectional views which illustrate progressive steps in the formation of another portion of an antifuse in accordance with the present invention.

Referring to FIG. 10, a portion 124 of a semiconductor device includes a substrate 36. The portion 124 of the semiconductor device further comprises a lower dielectric layer 128, a first metal layer 130, a first barrier layer 132, a first interfacial oxide film layer 134, and an antifuse dielectric layer 136. Layers 128, 130, 132, 134, and 136 are deposited in the same manner as described above and illustrated in FIGS. 2-4 for corresponding layers: lower dielectric layer 78, first metal layer 80, first barrier layer 82, interfacial oxide film layer 84, and antifuse dielectric layer 86.

Referring now to FIG. 11, a second interfacial oxide film layer 138 is formed on the exposed major surface of the antifuse dielectric layer 136. The second interfacial oxide film layer 138 is formed by the same process as the interfacial oxide film layer 84, described above and illustrated in FIG. 3, with the exception that the exposure time is between 4 minutes and 30 minutes, preferably 4 minutes to 6 minutes, as opposed to the 15 seconds to 30 minutes exposure time of the first interfacial oxide film layer 84. Beneficial effects of varying degrees can be produced by other exposure times. Furthermore, those skilled in the art know that the appropriate exposure time is dependent on the process parameters, such as temperature and pressure, all of which may be varied while still producing the same result.

Referring now to FIG. 12, the second interfacial oxide film layer 138 has deposited on its exposed major surface a second barrier layer 140. The second barrier layer 140 is deposited in the same manner as second barrier layer 88, described above and illustrated in FIG. 4. After deposition of the second barrier layer 140, the antifuse 141 and the first metal contacts 130a, 130b are patterned and etched in the same manner as the antifuse 89 and first metal contacts 80a, 80b, respectively, described above and illustrated in FIG. 5.

After the antifuse 141 and the first metal contacts 130a, 130b are patterned, the intermetal dielectric layer 144 and the second metal layer contacts 154a, 154b are formed in the same manner as intermetal dielectric layer 92 and second metal layer contacts 102a, 102b, respectively, described above and illustrated in FIG. 6-9.

By this arrangement, second metal layer contact 154a is electrically connected with the antifuse 141 by means of surface 146. Similarly, second metal layer contact 154b is electrically connected with first metal layer interconnect 130b by means of surface 148. The programming voltage is a function of the thickness of the first interfacial oxide film layer 134, antifuse dielectric layer 136, and second interfacial oxide film layer 138.

The addition of the first interfacial oxide film layer 134 and second interfacial oxide film layer 138 significantly narrows the range of programming voltages of the antifuses. Empirical testing indicated that the addition of the two oxidation film layers 134, 138 reduced the standard deviation of the antifuse programming voltage distribution by at least 25% to 50%. The addition of the interfacial oxide film layers 134, 138 also produces an improvement in the yield and long term reliability of the antifuses. Empirical accelerated life testing indicated that the addition of interfacial oxide film layers 134, 138 reduces the predicted failure rate of the antifuses under normal operating conditions by several orders of magnitude. It is believed that a substantial part of these improvements are due to the first interfacial oxide film layer 134. These improvements are especially significant to the hi-rel market.

Although the second interfacial oxide film layer 138 is shown deposited on the antifuse dielectric layer 136 and in contact with the second barrier layer 140, for purposes of the present invention, this is not to the exclusivity of other materials which may also be deposited between the antifuse dielectric layer 136 and second barrier layer 140 as long as the second interfacial oxide film layer 138 is disposed between the antifuse dielectric layer 136 and the second barrier layer 140. Furthermore, although the second interfacial oxide film layer 138 is shown along with the first interfacial oxide film layer 134, the second interfacial oxide film layer 138, could be used in an antifuse with or without the first interfacial oxide film layer 134. In addition, although the antifuse 141 is shown in a semiconductor device that contains internal transistors for addressing and programming the antifuse 141, this is not to the exclusion of other types of devices, both semiconductor and non semiconductor, in which the antifuse 141 may be formed.

FIGS. 13-19 are cross-sectional views which illustrate progressive steps in the formation of an antifuse in accordance with the present invention.

Figure 13:
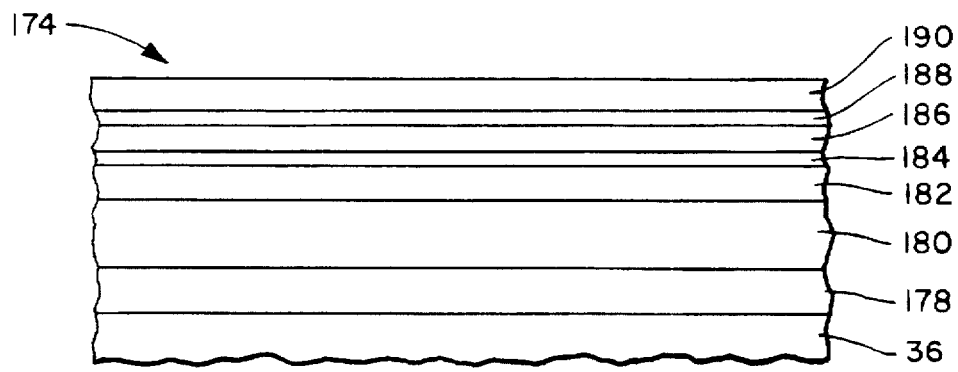
FIGS. 13–19 are cross-sectional views of the antifuse of the present invention.

Referring to FIG. 13, a portion 174 of a semiconductor device includes a substrate 36. The portion 174 of the semiconductor device further comprises a lower dielectric layer 178, a first metal layer 180, a first barrier layer 182, a first interfacial oxide film layer 184, an antifuse dielectric layer 186, a second interfacial oxide film layer 188, and a second barrier layer 190. Layers 178, 180, 182, 184, 186, and 190 are deposited in the same manner as described above and illustrated in FIGS. 24 for corresponding layers, lower dielectric layer 78, first metal layer 80, first barrier layer 82, interfacial oxide film layer 84, antifuse dielectric layer 86, and second barrier layer 88. The second interfacial oxide film layer 188 is formed in the same manner as described above and illustrated in FIG. 11 for second interfacial oxidation layer 138.

Figure 14:
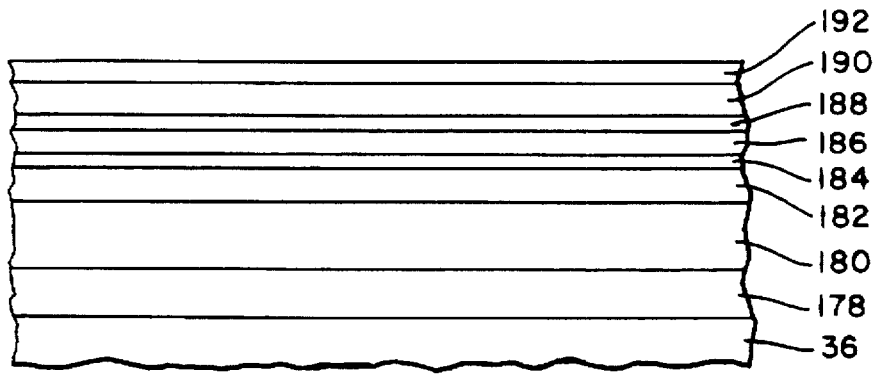

Referring now to FIG. 14, a metal cap layer 192 is deposited on the exposed major surface of the second barrier layer 190. One purpose of the metal cap layer 192 is to prevent erosion of the second barrier layer 190 by the subsequent via etch step described in detail hereinafter. The metal cap layer 192 provides better selectivity to the subsequent via etch step than a second barrier layer that is comprised of TiW. In the preferred embodiment, the metal cap layer is an aluminum-silicon composition, comprising substantially 99% aluminum and 1% silicon by weight, however, any electrical conductor that is selective to the subsequent via etch step and/or which can be used as a sacrificial layer, and yet capable of being patterned and etched itself may be used. An electrical conductor that is selective to the via etch is one which has an etch rate lower than that of the second barrier layer, for example aluminum and most aluminum alloys, including but not limited to aluminum alloys that include one or more of copper, silicon, and titanium. It is believed that copper, molybdenum, silver, or tantalum, may also be used. It is further believed that gold could be used in non integrated circuit applications. A sacrificial layer is one which may have an etch rate comparable to the second barrier layer, but which provides an adequate film thickness to allow the via etch to be completed without etching into the second barrier layer. Depending on the choice of etch chemistry for the via etch, suitable materials for a sacrificial layer may include, for example, any or all of the materials mentioned above as selective to the via etch. The term electrical conductor is not limited to metals and includes for example conductive oxides.

In the preferred embodiment, the metal cap layer 192 is sputter deposited using a sputtering machine such as a VARIAN model 3190 sputtering machine, although other satisfactory semiconductor processing techniques known to those skilled in the art may also be used. The sputter deposition pressure should be between 1 milliTorr and 50 milliTorr, preferably 5 milliTorr to 20 milliTorr. The sputter environment is substantially pure Argon. The temperature should range between 25 deg C and 400 deg C, preferably 25 deg C to 150 deg C. The power setting of the sputtering machine will depend on the particular machine and chosen process conditions. In the preferred embodiment, the power setting of the VARIAN model 3190 is about 22%. The deposition time is chosen to achieve the desired thickness. In the preferred embodiment, the deposition time is substantially in the range of from 25 seconds down to 10 seconds. However, those skilled in the art know that the appropriate deposition time depends on the process parameters, such as temperature, pressure and power, all of which could conceivably be varied without changing the result. The thickness of the metal cap layer 192 should be great enough to allow a continuous layer to be formed repeatably, ie. no isolated island formation, yet not so thick that layer delamination is induced. The range of suitable thicknesses depends on the material or materials used for the metal cap layer 192. For a metal cap layer comprised of copper, molybdenum, silver or tantalum, it is believed that the low end of the thickness range is at least as low as 300 angstroms. For the 99% aluminum and 1% silicon composition, a low end thickness of 500 angstroms has been demonstrated. It is believed that a similar low end thickness could be demonstrated for aluminum and other aluminum alloys. On the upper end, it is believed that a thickness above 10,000 angstroms could present a delamination problem for a metal cap layer comprised of aluminum, aluminum alloys, copper, molybdenum, silver, or tantalum. The preferred range for the 99% aluminum and 1% silicon composition, as well as aluminum and other aluminum alloys, is from 800 angstroms to 1200 angstroms.

Figure 15:
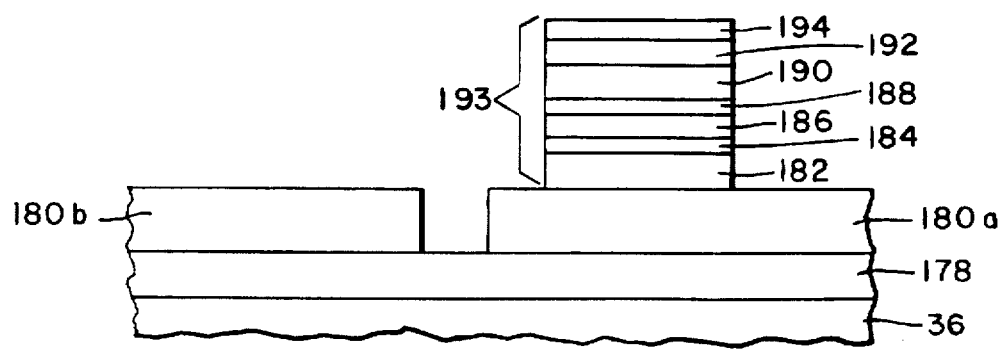

Referring now to FIG. 15, after deposition of the metal cap layer 192, the antifuse 193 is patterned and etched in the same manner as the antifuse 89, described above and illustrated in FIG. 5, with the exception that BCl$_3$ and Cl$_2$ are used at a DC bias of −265 volts to etch the metal cap layer 192. Once through the metal cap layer 192 and into the second barrier layer 190, BCl$_3$ and Cl$_2$ are turned off and the DC bias is set to −190 volts for the remainder of the etch.

After the antifuse 193 is patterned and etched, first metal contacts 180a, 180b are patterned in the same manner as first metal contacts 80a, 80b, described above and illustrated in FIG. 5.

Figure 16:
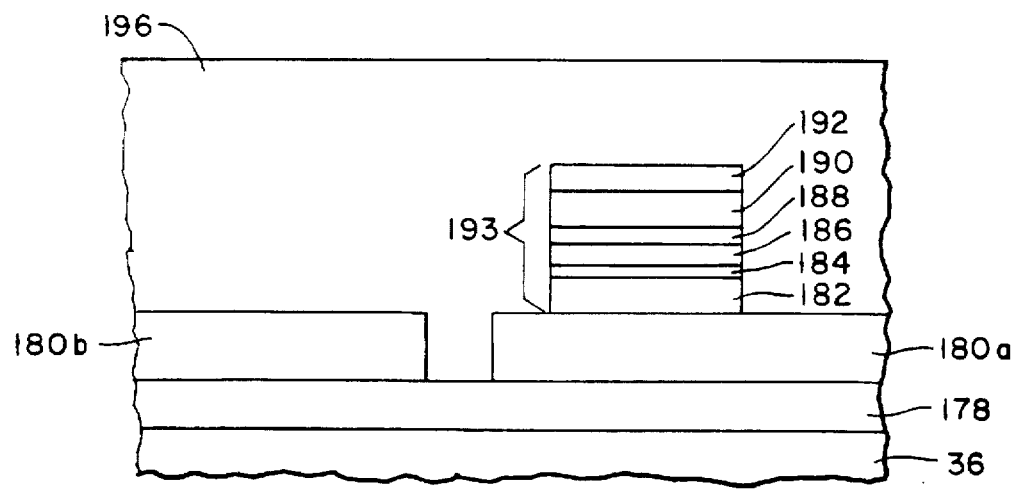

Referring now to FIG. 16, intermetal dielectric layer 196 is formed in the same manner as intermetal dielectric layer 92, described above and illustrated in FIG. 6.

Figure 17:
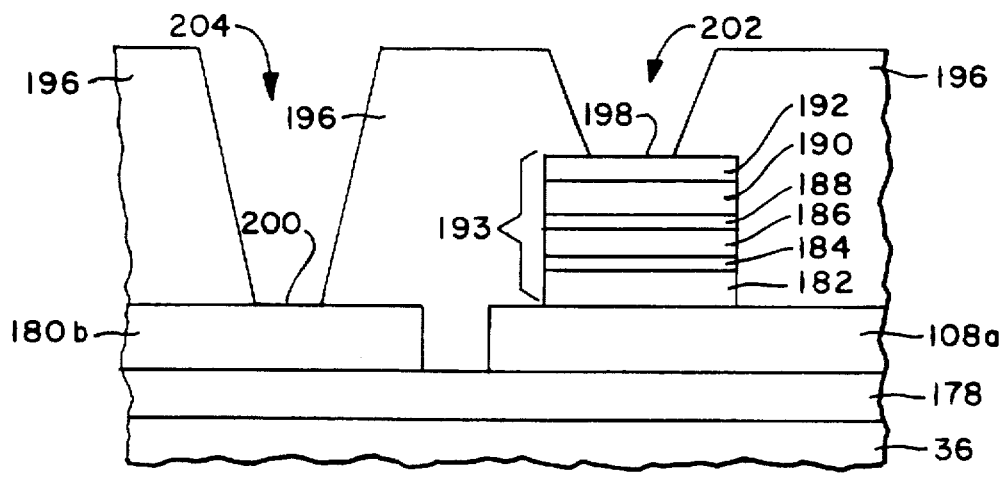

Referring now to FIG. 17, via 202 to the surface 198 of the antifuse 193 and via 204 to the surface 200 of first metal layer interconnect 180b are formed in the same manner as via 98 to the surface 94 of the antifuse 89 and via 100 to the surface 96 of first metal layer interconnect 80b, respectively, described above and illustrated in FIG. 7, with the exception that the antifuse via etching is adjusted to accommodate the additional metal cap layer 192.

Figure 18:
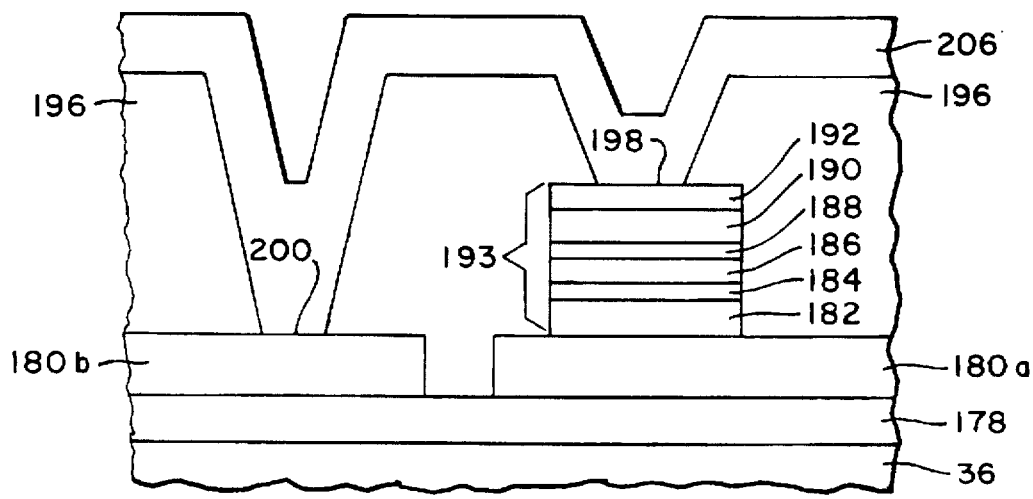

Referring now to FIG. 18, the second metal layer 206 is formed in the same manner as the second metal layer 102, described above and illustrated in FIG. 8.

Figure 19:
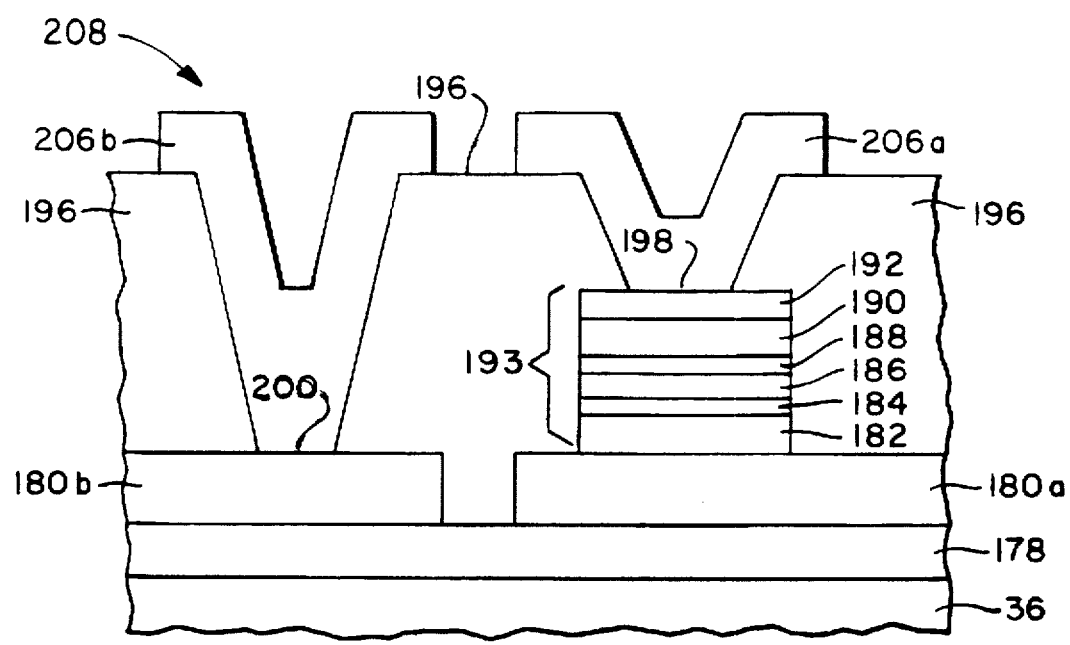

Referring now to FIG. 19, the second metal layer contacts 206a, 206b are formed in the same manner as second metal layer contacts 102a, 102b, respectively, described above and illustrated in FIG. 9.

By this arrangement, second metal layer contact 206a is electrically connected with the antifuse 193 by means of surface 198. Similarly, second metal layer contact 206b is electrically connected with first metal layer interconnect 180b by means of surface 200.

The resulting structure of FIG. 19 illustrates an antifuse structure in accordance with the present invention. The antifuse 193 is programmed in the same manner as prior art devices, described hereinbefore with respect to FIG. 1, whereby transistors, internal to the programmable integrated circuit, create electrically conductive paths from an external power supply to the second metal layer contact 206a, and from the first metal layer interconnect 180a to ground. A positive voltage and ground are thereby applied to the metal cap layer 192 and electrode 182 respectively. The voltage is electrically conducted through the metal cap layer 192 to the second barrier layer 190, resulting in the application of an electric field across the antifuse 193. The antifuse 193 could alternatively be programmed by applying a positive voltage to electrode 182 and ground to the metal cap layer 192, however, the magnitude of the programming voltage would need to be adjusted somewhat to compensate for the sensitivity of the programming voltage of the antifuse 193 to polarity of the programming voltage.

The programming voltage is a function of the thickness of the first interfacial oxide film layer 184, antifuse dielectric layer 186, and second interfacial oxide film layer 188. The positive programming voltage is preferably in the range of approximately 7.5 volts to 12 volts, and a sufficiently high enough current passes through the antifuse 193 to cause the antifuse dielectric layer 186 and the first and second interfacial oxide film layers 184, 188 to break down to produce a low resistance path. The resultant resistance of the post-programmed antifuse is approximately 300 Ohms ($\Omega$). The exact resistance value depends on the magnitude of the programming voltage and the size of the transistor(s) which limit the programming current. Thus, the post-programmed resistance can be less than 300 $\Omega$. In contrast, however, the pre-programmed resistance of the antifuse is approximately $1 \times 10^9$ $\Omega$.

Although the metal cap layer 192 is shown in the antifuse 193 along with two interfacial oxide film layers 184, 188, metal cap layer 192 can also be used in antifuses that have one interfacial oxide film layer or no interfacial oxide film layers. The metal cap layer 192 improves antifuse yield by up to an order of magnitude compared to an antifuse with interfacial oxide film layers alone. The metal cap layer 192 may also provide some further improvement in long term reliability, beyond the improvement provided by the interfacial oxide film layers.

Furthermore, although the metal cap layer 192 is shown deposited on the second barrier layer 190, for purposes of the present invention, this is not to the exclusivity of other materials which may be deposited between the metal cap layer 192 and the second barrier layer 190 as long as the metal cap layer is deposited subsequent to deposition of the second barrier layer 190. In addition, although the antifuse 193 is shown in a semiconductor device that contains internal transistors for addressing and programming the antifuse 193, this is not to the exclusion of other types of devices, both semiconductor and non semiconductor, in which the antifuse 193 may be formed.

While the particular invention has been described with reference to illustrative embodiments, this description is not meant to be construed in a limiting sense. It is understood that, various modifications of the illustrative embodiments, as well as additional embodiments of the invention, will be apparent to persons skilled in the art upon reference to this description without departing from the spirit of the invention, as recited in the claims appended hereto. Thus, upon understanding the present invention, one of ordinary skill in the art could employ the present invention in a variety of applications requiring antifuse technology. These applications include but are not limited to programmable devices such as programmable read only memories, programmable array logic units, and field programmable gate arrays, programmable controllers, as well as other programmable circuits. It is therefore contemplated that the appended claims will cover any such modifications or embodiments as fall within the true scope of the invention.

What is claimed is:

1. A method of fabricating an antifuse on a substrate, comprising the steps of:

depositing a first barrier layer on the substrate;

depositing a dielectric layer superjacent said first barrier layer; and depositing a second barrier layer superjacent said dielectric layer;

depositing a metal cap layer superjacent said second barrier layer to define the antifuse, said metal cap layer comprising an electrically conductive material that is more selective to via etch chemistries than is said second barrier layer and etching said metal cap layer, said second barrier layer, said dielectric layer and said first barrier layer to remove said second barrier layer, said dielectric layer and said first barrier layer not underlying said metal cap layer.

2. The method of claim 1, wherein said step of depositing a metal cap layer comprises depositing a metal cap layer by sputtering.

3. The method of claim 2, wherein said sputtering is performed at a pressure in the range from five milliTorr to twenty milliTorr and at a temperature in the range of from twenty five degrees C to one hundred fifty hundred degrees C.

4. The method of claim 2, wherein said sputtering is performed at a pressure in the range from one milliTorr to fifty milliTorr and at a temperature in the range of from twenty five degrees C to four hundred degrees C.

5. The method of claim 4, wherein said electrically conductive material that is more selective to via etch chemistries than is said second barrier layer is comprised of aluminum material.

6. The method of claim 4, wherein said electrically conductive material that is more selective to via etch chemistries than is said second barrier layer comprises an aluminum alloy material.

7. The method of claim 6, wherein said metal cap layer has a thickness that is in the range of five hundred angstroms to ten thousand angstroms.

8. The method of claim 6, wherein said metal cap layer has a thickness that is in the range of eight hundred angstroms to twelve hundred angstroms.

9. A method of fabricating an antifuse on a substrate, comprising the steps of:

depositing a first barrier layer on the substrate, said first barrier layer having an exposed major surface;

placing the substrate and said deposited first barrier layer in a chamber;

providing a monatomic oxygen environment within said chamber;

subjecting said first barrier layer to said monatomic oxygen environment for an interval of time sufficient to produce a first interfacial oxide layer on said exposed major surface of said first barrier layer; said first interfacial oxide layer having a thickness greater than ten angstroms;

depositing a dielectric layer superjacent said first interfacial oxide layer, said dielectric layer having an exposed major surface;

placing the substrate and said deposited first barrier layer and said first interfacial oxide layer and said dielectric layer in a chamber;

providing a monatomic oxygen environment within said chamber;

subjecting said dielectric layer to said monatomic oxygen environment for an interval of time sufficient to produce a second interfacial oxide layer on said exposed major surface of said dielectric layer; said second interfacial oxide layer having a thickness greater than ten angstroms;

depositing a second barrier layer superjacent said second interfacial oxide layer;

depositing a metal cap layer superjacent said second barrier layer, said metal cap layer comprising an electrically conductive material that is more selective to via etch chemistries than is said second barrier layer.

10. The method of claim 9, wherein said step of providing a monatomic oxygen environment within said chamber comprises the steps of:

producing a chamber environment having an ambient temperature of from one hundred degrees Celsius to four hundred degrees Celsius and an ambient pressure of from ten milliTorr to five hundred Torr;

exposing an oxygen gas to a radio frequency electric field to produce an ionized oxygen gas; and introducing said ionized gas into said chamber environment to produce said monatomic oxygen environment.

11. The method of claim 10, wherein said step of exposing oxygen gas to a radio frequency electric field comprises the step of:

providing said radio frequency electric field at a frequency of substantially thirteen thousand five hundred Kilohertz.

12. The method of claim 10 wherein said first barrier layer is subjected to said monatomic oxygen environment for an interval of from fifteen seconds to thirty minutes.

13. The method of claim 10 wherein said dielectric layer is subjected to said monatomic oxygen environment for an interval of from four minutes to thirty minutes.

14. The method of claim 10 wherein said chamber environment ambient temperature is in the range of from one hundred sixty degrees Celsius to two hundred sixty degrees Celsius, and said first barrier layer is subjected to said monatomic oxygen environment for an interval of from one minute to ten minutes.

15. The method of claim 10 wherein said chamber environment ambient temperature is in the range of from one hundred sixty degrees Celsius to two hundred sixty degrees Celsius, and said dielectric layer is subjected to said monatomic oxygen environment for an interval of from four minutes to six minutes.

16. The method of claim 9, wherein said step of depositing a metal cap layer comprises depositing a metal cap layer by sputtering.

17. The method of claim 16, wherein said sputtering is performed at a pressure in the range from five milliTorr to twenty milliTorr and at a temperature in the range of from twenty five degrees C to one hundred fifty hundred degrees C.

18. The method of claim 16, wherein said sputtering is performed at a pressure in the range from one milliTorr to fifty milliTorr and at a temperature in the range of from twenty five degrees C to four hundred degrees C.

19. The method of claim 18, wherein said electrically conductive material that is more selective to via etch chemistries than is said second barrier layer is comprised of aluminum material.

20. The method of claim 18, wherein said electrically conductive material that is more selective to via etch chemistries than is said second barrier layer comprises an aluminum alloy material.

21. The method of claim 20, wherein said metal cap layer has a thickness that is in the range of five hundred angstroms to ten thousand angstroms.

22. The method of claim 20, wherein said metal cap layer has a thickness that is in the range of eight hundred angstroms to twelve hundred angstroms.

23. The method of claim 9, wherein said interval of time sufficient to produce a first interfacial oxide layer is not continuous and is interrupted by exposure to an ambient environment.

24. The method of claim 9, wherein said interval of time sufficient to produce a second interfacial oxide layer is not continuous and is interrupted by exposure to an ambient environment.

25. A method of fabricating an antifuse on a substrate, comprising the steps of:

depositing a first barrier layer on the substrate, said first barrier layer having an exposed major surface;

placing the substrate and said deposited first barrier layer in a chamber;

providing a monatomic oxygen environment within said chamber;

subjecting said first barrier layer to said monatomic oxygen environment for an interval of time sufficient to produce an interfacial oxide layer on said exposed major surface; said interfacial oxide layer having a thickness greater than ten angstroms;

depositing a dielectric layer superjacent said interfacial oxide layer;

depositing a second barrier layer superjacent said dielectric layer; and depositing a metal cap layer superjacent said second barrier layer, said metal cap layer comprising an electrically conductive material that is more selective to via etch chemistries than is said second barrier layer.

26. A method of fabricating an antifuse on a substrate, comprising the steps of:

depositing a first barrier layer on the substrate;

depositing a dielectric layer superjacent said first barrier layer;

depositing a second barrier layer superjacent said dielectric layer; and depositing a metal cap layer superjacent said second barrier layer to define the antifuse, said metal cap layer comprising an electrically conductive material that is suitable for use as a sacrificial layer and etching said metal cap layer, said second barrier layer, said dielectric layer and said first barrier layer to remove said second barrier layer, said dielectric layer and said first barrier layer not underlying said metal cap layer.

27. A method of fabricating an antifuse on a substrate, comprising the steps of:

depositing a first barrier layer on the substrate, said first barrier layer having an exposed major surface;

placing the substrate and said deposited first barrier layer in a chamber;

providing a monatomic oxygen environment within said chamber;

subjecting said first barrier layer to said monatomic oxygen environment for an interval of time sufficient to produce an interfacial oxide layer on said exposed major surface; said interfacial oxide layer having a thickness greater than ten angstroms;

depositing a dielectric layer superjacent said interfacial oxide layer;

depositing a second barrier layer superjacent said dielectric layer; and depositing a metal cap layer superjacent said second barrier layer, said metal cap layer comprising an electrically conductive material that is suitable for use as a sacrificial layer.

* * * * *